: US010056499B2

(12) United States Patent
Padmanabhan et al.

(10) Patent No.: US 10,056,499 B2
(45) Date of Patent: Aug. 21, 2018

(54) BIDIRECTIONAL JFET AND A PROCESS OF FORMING THE SAME

(71) Applicant: SEMICONDUCTOR COMPONENTS INDUSTRIES, LLC, Phoenix, AZ (US)

(72) Inventors: Balaji Padmanabhan, Scottsdale, AZ (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/254,837

(22) Filed: Sep. 1, 2016

(65) Prior Publication Data

US 2018/0061998 A1 Mar. 1, 2018

(51) Int. Cl.
*H01L 29/15* (2006.01)
*H01L 29/808* (2006.01)
*H01L 29/20* (2006.01)
*H01L 29/423* (2006.01)
*H01L 29/43* (2006.01)
(Continued)

(52) U.S. Cl.
CPC ...... *H01L 29/8083* (2013.01); *H01L 29/0653* (2013.01); *H01L 29/1066* (2013.01); *H01L 29/2003* (2013.01); *H01L 29/404* (2013.01); *H01L 29/407* (2013.01); *H01L 29/41741* (2013.01); *H01L 29/42316* (2013.01); *H01L 29/432* (2013.01); *H01L 29/66909* (2013.01)

(58) Field of Classification Search
CPC ............ H01L 29/8083; H01L 29/0653; H01L 29/1066; H01L 29/2003
See application file for complete search history.

(56) References Cited

U.S. PATENT DOCUMENTS

2002/0096709 A1 7/2002 Wu et al.
2004/0207027 A1 10/2004 Wu et al.
(Continued)

OTHER PUBLICATIONS

Nee, Hans-Peter. "High Efficiency Silicon Carbide Power Electronics." 2014 IEEE Applied Power Electronics Conference and Exposition—APEC 2014. Mar. 16-20, 2014. Fort Worth, TX, pp. 1-119.

*Primary Examiner* — Matthew Gordon
(74) *Attorney, Agent, or Firm* — Abel Law Group, LLP

(57) ABSTRACT

An electronic device comprising a bidirectional JFET can include a drain/source region; a lightly doped semiconductor layer overlying the drain/source region; a source/drain region overlying the lightly doped semiconductor layer; a trench extending through the source/drain region and into the lightly doped semiconductor layer; a gate electrode of the bidirectional JFET within the trench; and a field electrode within the trench. A process of forming an electronic device can include providing a workpiece including a first doped region and a lightly doped semiconductor layer overlying the first doped region; defining a trench extending into the lightly doped semiconductor layer; forming a gate electrode within the trench, wherein the gate electrode extends to a sidewall of the trench; and forming a field electrode within the trench, wherein a bidirectional JFET includes the first doped region, the lightly doped semiconductor layer, a second doped region, and the gate electrode.

20 Claims, 4 Drawing Sheets

(51) Int. Cl.
*H01L 29/40* (2006.01)
*H01L 29/06* (2006.01)
*H01L 29/417* (2006.01)
*H01L 29/66* (2006.01)
*H01L 29/10* (2006.01)

(56) References Cited

U.S. PATENT DOCUMENTS

| | | |
|---|---|---|
| 2005/0230745 A1 | 10/2005 | Fatemizadeh et al. |
| 2006/0060884 A1* | 3/2006 | Ohyanagi ......... H01L 29/66416 257/133 |
| 2006/0197105 A1 | 9/2006 | Carta et al. |
| 2012/0319127 A1 | 12/2012 | Chowdhury et al. |
| 2013/0299882 A1 | 11/2013 | Disney et al. |
| 2014/0054682 A1* | 2/2014 | Padmanabhan ....... H01L 29/404 257/330 |
| 2014/0103428 A1* | 4/2014 | Kim ................... H01L 29/0634 257/330 |
| 2014/0361349 A1* | 12/2014 | Alexandrov ........ H01L 29/8083 257/263 |

* cited by examiner

US 10,056,499 B2

BIDIRECTIONAL JFET AND A PROCESS OF FORMING THE SAME

FIELD OF THE DISCLOSURE

The present disclosure relates to transistors, and more particularly, to bidirectional junction field-effect transistors.

RELATED ART

Bidirectional transistors are useful in battery charging application, such as electric vehicles in the automotive industry. The bidirectional transistors are typically power metal-oxide-semiconductors field-effect transistors (MOSFETs). However, such MOSFETs may be limited in their performance characteristics, such as on-state resistance. Further improvement in bidirectional transistors is desired.

BRIEF DESCRIPTION OF THE DRAWINGS

Embodiments are illustrated by way of example and are not limited in the accompanying figures.

Figure 1:
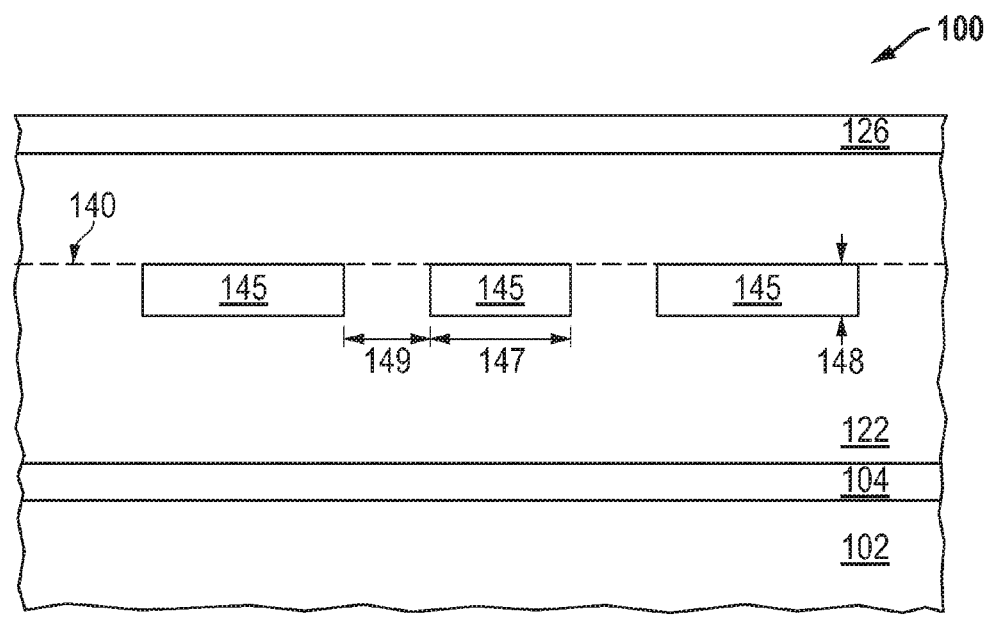
FIG. 1 includes an illustration of a cross-sectional view of a portion of a workpiece that includes a substrate, a heavily doped buried region, a lightly doped semiconductor layer, and doped regions within the lightly doped semiconductor layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_y Ga_{(1-y)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

The term "heavily doped," when referring to a layer or region is intended to mean that such layer or region can form an ohmic contact, as opposed to a Schottky contact, when a metal-containing material contacts such layer or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, is intended to mean that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a bidirectional JFET including a drain/source region; a lightly doped semiconductor layer overlying the drain/source region; a source/drain region overlying the drain/source region and the lightly doped semiconductor layer; a trench extending into the lightly doped semiconductor layer; a gate electrode within the trench; and a field electrode within the trench. Thus, a vertical bidirectional JFET can be formed with at least one field electrode. In an embodiment with a single field electrode within each trench, the field electrode can extend above and below the gate electrode. In another embodiment with at least two field electrodes within each trench, one of the field electrodes can be disposed below the gate electrode, and another field electrode can be disposed above the gate electrode. Thus, the JFET can have good on-state resistance and drain-to-source breakdown voltage.

A process of forming an electronic device can include providing a workpiece including a first doped region and a lightly doped semiconductor layer overlying the first doped region; patterning the lightly doped semiconductor layer to define a trench extending into the lightly doped semiconductor layer; forming a first insulating layer along a bottom and sidewall of the trench; forming a gate electrode within the trench after forming the first insulating layer, wherein the gate electrode extends to a sidewall of the trench; forming a second insulating layer within the trench after forming the gate electrode; and forming a first field electrode within the trench, wherein a bidirectional JFET includes the first doped region, the lightly doped semiconductor layer, and the gate electrode. The first doped region can be a source/drain region, and a second doped region can be a drain/source region for the JFET. The second doped region can be located near the top of the trench and may be formed before or after forming the trench.

The concepts as described herein are better understood with the embodiments as illustrated and described below. Such embodiments are intended to exemplify and not limit the scope of the present invention, which is defined by the appended claims.

FIG. 1 includes an illustration of a cross-sectional view of a portion of a workpiece 100 that includes a substrate 102, a heavily doped buried region 104, and a lightly doped semiconductor layer 122, a heavily doped surface region 126, and doped regions 145. The heavily doped buried region 104 is a source/drain region, and heavily doped surface region 126 will become drain/source regions for the bidirectional JFET. The heavily doped buried region 104 is the drain and the heavily doped surface region 126 is the source when the heavily doped buried region 104 is at a higher voltage than the heavily doped surface region 126. The heavily doped buried region 104 is the source and the heavily doped surface region 126 is the drain when the heavily doped surface region 126 is at a higher voltage than the heavily doped buried region 104. The doped regions 145 will be electrically connected to a subsequently-formed gate electrode. The configuration and biasing of the doped regions 145 will be used to turn off or turn on the transistor, as will be described in more detail later in this specification. Materials and other considerations will be described in more detail with respect to the structure as illustrated in FIG. 1.

The substrate 102 can include a base material. In an embodiment, the base material can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. If needed or desired, a buffer layer may be formed over the base material to allow a monocrystalline semiconductor material having a desired crystal orientation to be formed over the base material.

The materials for the heavily doped buried region 104, the lightly doped semiconductor layer 122, the heavily doped surface region 126, and doped regions 145 depend on the type of electronic device being formed. In an embodiment, the heavily doped buried region 104, the lightly doped semiconductor layer 122, the heavily doped surface region 126, and doped regions 145 can include a compound semiconductor material (e.g., a III-V compound, or a II-V compound), monocrystalline silicon, or diamond. The III-V compound can include III-N, III-As, and the III element may be selected from Al, Ga, In, or any combination thereof. The II-VI compound can include II-O, II-S, II-Se, or II-Te, and the II element can include Zn, Cd, Hg, Pb, or the like.

For purposes of simplicity, the discussion below is directed to AlGaN materials. Clearly, other materials can be used. After reading this specification, skilled artisans will be able to select materials and appropriate dopants for electron donors and electron acceptors. In an embodiment, the heavily doped buried region 104, lightly doped semiconductor layer 122, the heavily doped surface region 126 and doped regions 145 include $Al_xGa_{(1-x)}N$, where $0 \leq x \leq 0.2$. In a particular embodiment, the heavily doped buried region 104, lightly doped semiconductor layer 122, the heavily doped surface region 126 and doped regions 145 include GaN (x=0 in the formula above).

The heavily doped buried region 104, the lightly doped semiconductor layer 122, and the heavily doped surface region 126 can include one or more dopants that are electron donors (which may also be referred to as N-type dopants), and the doped regions 145 can include electron acceptors (which may also be referred to as a P-type dopant). The heavily doped buried region 104 can have a thickness in a range of 2.0 microns to 1000.0 microns and a dopant concentration of $1\times10^{17}$ atoms/cm$^3$ to $1\times10^{20}$ atoms/cm$^3$.

The lightly doped semiconductor layer 122 has a thickness and dopant concentration that may depend on the voltage rating of the bidirectional JFET being formed, and the materials for the heavily doped buried region 104, the lightly doped semiconductor layer 122, the heavily doped surface region 126, and doped regions 145. For a bidirectional JFET having a voltage rating of 600 V, and the regions 104, 122, 126 and 145 include Al$_x$Ga$_{(1-x)}$N, wherein 0<x<0.25, or GaN, the lightly doped semiconductor layer 122 may have a thickness in a range of 5.0 microns to 30.0 microns, and a dopant concentration of $1\times10^{15}$ atoms/cm$^3$ to $1\times10^{17}$ atoms/cm$^3$. In another embodiment, for a bidirectional JFET having a voltage rating of 150 V, and the regions 104, 122, 126 and 145 include Si, the lightly doped semiconductor layer 122 may have a thickness in a range of 10 microns to 20 microns, and a dopant concentration of $5.0\times10^{15}$ atoms/cm$^3$ to $1.0\times10^{17}$ atoms/cm$^3$. For a lower voltage rating, the lightly doped semiconductor layer 122 may be thinner, and for a higher voltage rating, the lightly doped semiconductor layer 122 may be thicker. In another embodiment, the thickness and dopant concentration of the lightly doped semiconductor layer 122 may be less than or greater than those values recited above.

The heavily doped surface region 126 can have a thickness in a range of 0.25 micron to 2.0 microns and a dopant concentration of $1\times10^{18}$ atoms/cm$^3$ to $1\times10^{21}$ atoms/cm$^3$.

In a particular embodiment, the heavily doped buried region 104, the lightly doped semiconductor layer 122, and the heavily doped surface region 126 may be formed during the same semiconductor growth sequence. In another embodiment, the lightly doped semiconductor layer 122 can be formed during a semiconductor growth step, and the heavily doped surface region 126 can be formed during a separate doping operation, such as ion implantation. If needed or desired, the heavily doped surface region 126 may be formed later in the process flow, such as after forming subsequently-formed gate electrodes and field electrodes.

The locations of the doped regions 145 are within the lightly doped semiconductor layer 122 and, in an embodiment, are approximately halfway between the heavily doped buried region 104 and the heavily doped surface region 126. The doped regions 145 can have a dopant concentration in a range of $1\times10^{16}$ to $1\times10^{18}$ atoms/cm$^3$. In an embodiment, the doped regions 145 have a thickness, noted as dimension 148, in a range of 5% to 25% of the thickness of the combination of the lightly doped semiconductor layer 122 and the heavily doped surface region 126. The widths of the doped regions 145 are wider than the subsequently-formed trenches that will extend through the doped regions 145. In an embodiment, the doped regions 145 have widths, noted as dimension 147, a range of 0.3 micron to 3.0 microns, and the width of the lightly doped semiconductor layer 122 between the trenches is in a range of 0.2 micron to 5.0 microns. The spaces 149 between the doped regions 145 can depend on whether a depletion-mode or an enhancement-mode transistor is being formed. For a depletion-mode transistor, the spaces 149 can be in a range of 0.3 micron to 1.0 micron. For an enhancement-mode transistor, the spaces 149 may be less than 0.3 micron.

The doped regions 145 can be formed using one or more different techniques. In one embodiment, after forming the full thickness of the lightly doped semiconductor layer 122 and the heavily doped surface region 126, if present, a masking layer (not illustrated) is formed over the lightly doped semiconductor layer 122 and patterned to define openings below which the doped regions 145 are formed. Ion implantation can be performed to implant the dopant for the doped regions 145 at the desired depth. The masking layer is removed after ion implantation is completed. In another embodiment, the lightly doped semiconductor layer 122 can be partly grown to the thickness as indicated at dashed line 140. The masking layer can be formed, and the dopant implanted for the doped regions 145. The masking layer can be removed, and the remainder of the lightly doped semiconductor layer 122 is epitaxially grown. In a further embodiment, the doped regions 145 may be formed at a later point in the process flow, as will be described below.

Figure 2:
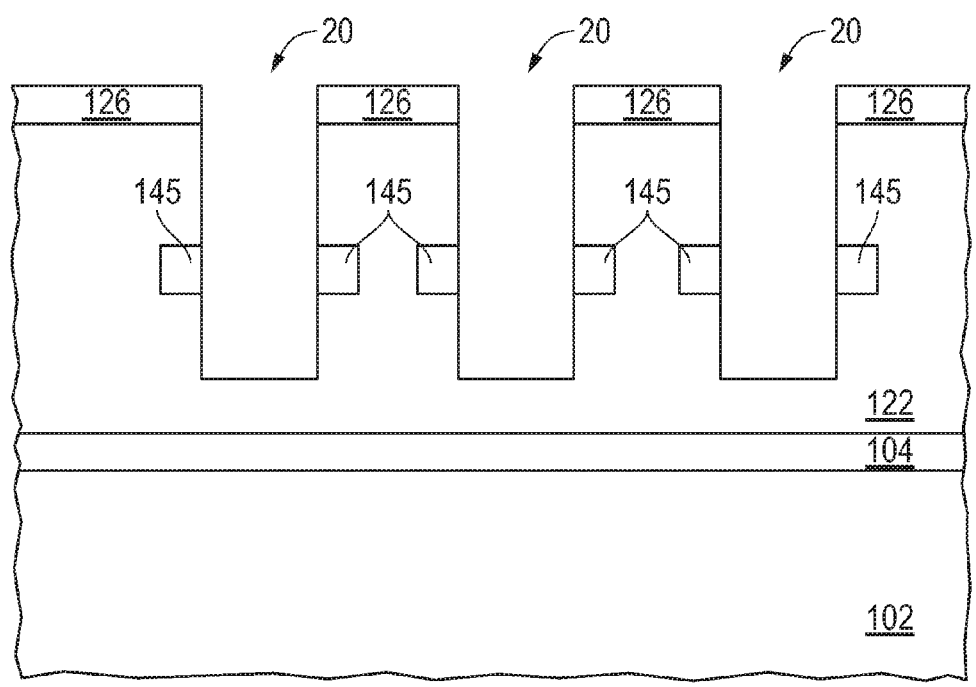
FIG. 2 includes an illustration of a cross-sectional view of the workpiece of FIG. 1 after forming trenches extending into the lightly doped semiconductor layer.

FIG. 2 includes an illustration of a cross-sectional view of the workpiece after layers have been patterned to define trenches 20. A masking layer (not illustrated) is formed over the heavily doped surface region 126 and includes openings corresponding to locations where the trenches 20 are formed. Portions of the heavily doped surface region 126, the lightly doped semiconductor layer 122, and the doped regions 145 are removed to define the trenches 20. In the embodiment as illustrated, the trenches 20 extend through and are surrounded by the doped regions 145. The depths of the trenches 20 (as measured between the bottoms of the trenches to the top of the heavily doped surface region 126 immediately adjacent to the trenches 20) depend on the thickness of the lightly doped semiconductor layer 122, and thus, expressing the depths of the trenches 20 are expressed as a function of the thickness of the lightly doped semiconductor layer 122. The depths of the trenches 20 are in a range of 20% to 120% of the combined thickness of the lightly doped semiconductor layer 122 and heavily doped surface region 126 (hereinafter, "Combined Thickness"). If the heavily doped surface region 126 is formed later in the process flow, the thickness of the lightly doped semiconductor layer 122 is used instead of the Combined Thickness. Hereinafter, the heavily doped surface region 126 (singular) will be referred to as the heavily doped surface regions 126 (plural), in view of the patterning that occurs when defining the trenches 20.

In another embodiment, at least some of the lightly doped semiconductor layer 122 may be disposed between the bottom of the trenches 20 and the heavily doped buried region 104. In a particular embodiment, the depths of the trenches 20 may be in a range of 75% to 95% of the Combined Thickness. The widths of the trenches 20 may be in a range of 0.1 micron to 3.0 microns, and the width of the lightly doped semiconductor layer 122 between the trenches 20 is in a range of 0.2 micron to 5.0 microns. The masking layer can be removed after defining the trenches 20. In an optional step and when the lightly doped semiconductor layer 122 and heavily doped surface region 126 include silicon, a sacrificial layer (not illustrated) may be grown as a thermal silicon oxide layer and removed to smooth the surfaces of the lightly doped semiconductor layer 122 and heavily doped surface regions 126 exposed within the trenches 20.

Figure 3:
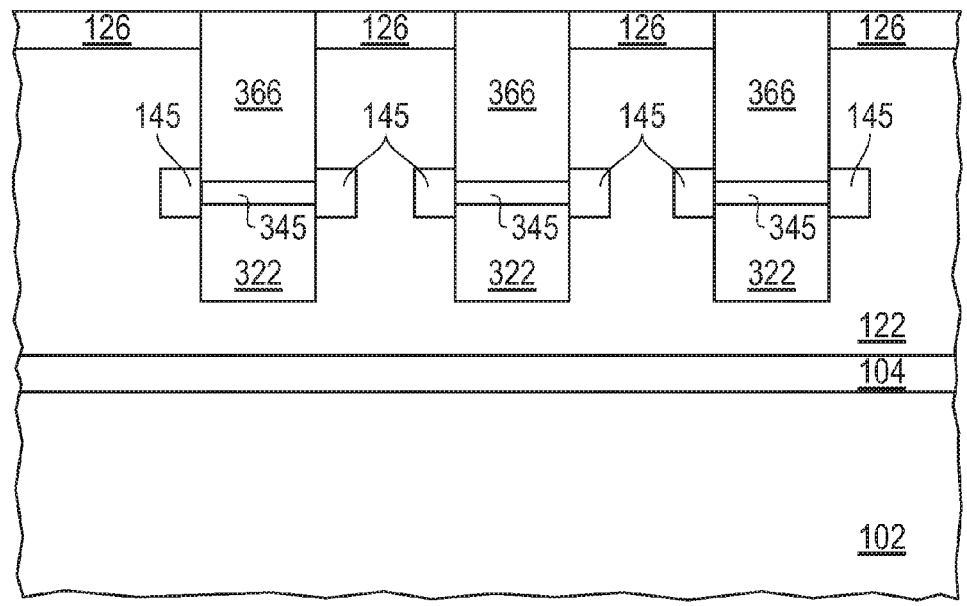
FIG. 3 includes an illustration of a cross-sectional view of the workpiece of FIG. 2 after forming filling the trenches, including forming gate electrodes.

FIG. 3 includes an illustration of a cross-sectional view of the workpiece after a lower insulating layer 322, gate electrodes 345, and an upper insulating layer 366 are formed in the trenches 20. The insulating layers 322 and 366 and gate electrodes 345 are formed so that the gate electrodes 345 contact the doped regions 145. In an embodiment, gate electrodes 345 do not contact the lightly doped semiconductor layer 122.

The lower insulating layer 322 can include an oxide, a nitride, an oxynitride, another dielectric material, or any combination thereof. The lower insulating layer 322 can be deposited and fill the trenches 20. The lower insulating layer 322 can be etched back so that the upper surface is at a desired elevation. In an embodiment, after the etch, the lower insulating layer 322 fills 25% to 40% of the depth of the trenches 20. In another embodiment, the lower insulating layer 322 may fill less of the trenches 20 or more of the trenches 20.

The gate electrodes 345 can include a conductive material. In the embodiment as illustrated, the workpiece may be exposed to a high temperature during subsequent processing, such as a dopant activation or drive. The gate electrodes 345 can include a conductive material, such as metal (atomic or in alloy form), a doped semiconductor material, a metal nitride, a metal silicide, or the like. If the workpiece will be exposed to a relatively high temperature, the conductive material can include a refractory metal, such as W, or a doped semiconductor material, such as heavily doped polycrystalline silicon. If the electronic device will not be exposed to a temperature higher than 400° C., other materials, such as Al, Cu, Au, or the like may be used. The layer for the gate electrodes 345 can be deposited and fill the trenches 20. The layer can be etched back so that the gate electrodes 345 have a thickness that is 5% to 20% of the depth of the trenches 20.

The upper insulating layer 366 can include any of the materials as described with respect to the lower insulating layer 322. The lower and upper insulating layers 322 and 366 can include the same or different materials. The lower insulating layer 322 can be deposited and fill the trenches 20. The upper insulating layer 366 can be etched back to expose the heavily doped surface regions 126 between the trenches 20. In the embodiment as illustrated, the upper insulating layer 366 fills the remainder of the trenches 20.

In another embodiment, the doped regions 145 can be formed by dopant diffusion from the gate electrodes 345, so that the doped regions 145 are self-aligned to the gate electrodes 345. In a particular embodiment, the gate electrodes 345 can include a dopant having the opposite conductivity type as compared to the lightly doped semiconductor layer 122. For example, the gate electrodes 345 can include an acceptor dopant (e.g., P-type dopant) when the lightly doped semiconductor layer 122 includes a donor dopant (e.g., N-type dopant). When the lightly doped semiconductor layer 122 includes GaN, the acceptor dopant may be Mg or Ca, and when the lightly doped semiconductor layer 122 includes Si, the acceptor dopant may be B or Al. Other acceptor dopants may be used for GaN, Si, or when the lightly doped semiconductor layer 122 includes another semiconductor material. After reading this specification, skilled artisans will be able to determine a particular dopant that meets the needs or desires for a particular application. When the lightly doped semiconductor layer 122 includes $Al_{(1-x)}Ga_xN$, where $0 \leq x \leq 0.2$, the gate electrodes 345 can include Mg-doped or Ca-doped $Al_{(1-y)}Ga_yN$, where $0 \leq y \leq 0.3$. In an embodiment, the gate electrodes 345 may include more Al than the lightly doped semiconductor layer 122. When the lightly doped semiconductor layer 122 includes Si, the gate electrodes 345 can include B-doped or Al-doped Si. The layer for the gate electrodes 345 can be formed as previously described. A dopant drive cycle can be performed to diffuse dopant from the gate electrodes 345 to form the doped regions 145. The dopant drive may be performed after the trenches 20 are filled and the heavily doped surface regions 126 are covered, for example, after the upper insulating layer 366 is deposited and before it is etched. The doped regions 145 will have a dopant concentration and dimensions as previously described.

Figure 4:
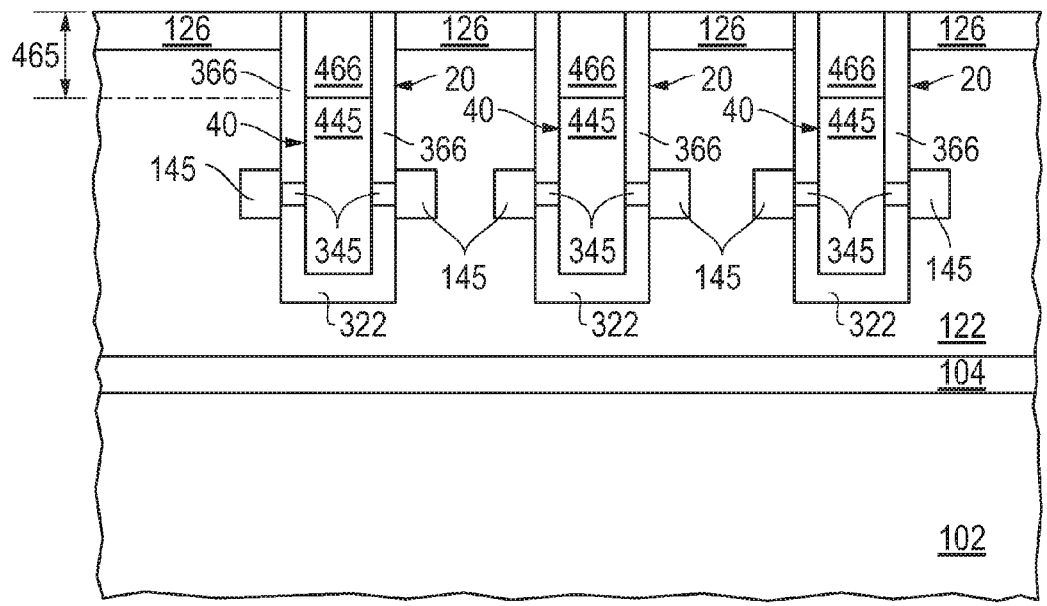
FIG. 4 includes an illustration of a cross-sectional view of the workpiece of FIG. 3 after forming openings within the trenches, forming field electrodes, and filling the openings.

FIG. 4 includes an illustration of a cross-sectional view of the workpiece after forming field electrodes 445 within openings 40. The field electrodes 445 can help to increase the drain-to-source breakdown voltage ($BV_{DS}$), decrease on-state resistance ($R_{DSON}$), improve another electronic property of the transistor, or any combination thereof. The field electrodes 445 can include any of the materials as described with respect to the gate electrodes 345. The field electrodes 445 and the gate electrodes 345 can include the same or different materials.

A masking layer (not illustrated) is formed over the workpiece, and the insulating layers 322 and 366 and the gate electrodes 345 are patterned to define the openings 40. In an embodiment, the openings 40 have depths (as measured between the bottoms of the openings 40 to the top of the heavily doped surface regions 126 immediately adjacent to the trenches 20) that are in a range of 75% to 95% of the depths of the trenches 20 in which such openings 40 reside. In another embodiment, the openings 40 have widths in a range of 20% to 50% of the widths of the trenches 20 in which such openings 40 reside.

Top surfaces of the field electrodes 445 may lie at elevations below the top surface of the lightly doped semiconductor layer 122, as noted by dimension 465 in FIG. 4. In an embodiment, the dimension 465 is in a range of 10% to 40% of the depths of the trenches 20. During deposition, the openings 40 may be completely filled with the conductive layer, and the conductive layer can be etched to recess the field electrodes 445, so that the top surfaces of the field electrodes 445 are at desired elevations. A capping insulating layer 466 can be formed to fill the openings 40. The capping insulating layer 466 can include any of the materials as previously described with respect to the lower insulating layer 322. The capping insulating layer 466 can include the same or different materials with respect to each of the insulating layers 322 and 366.

Figure 5:
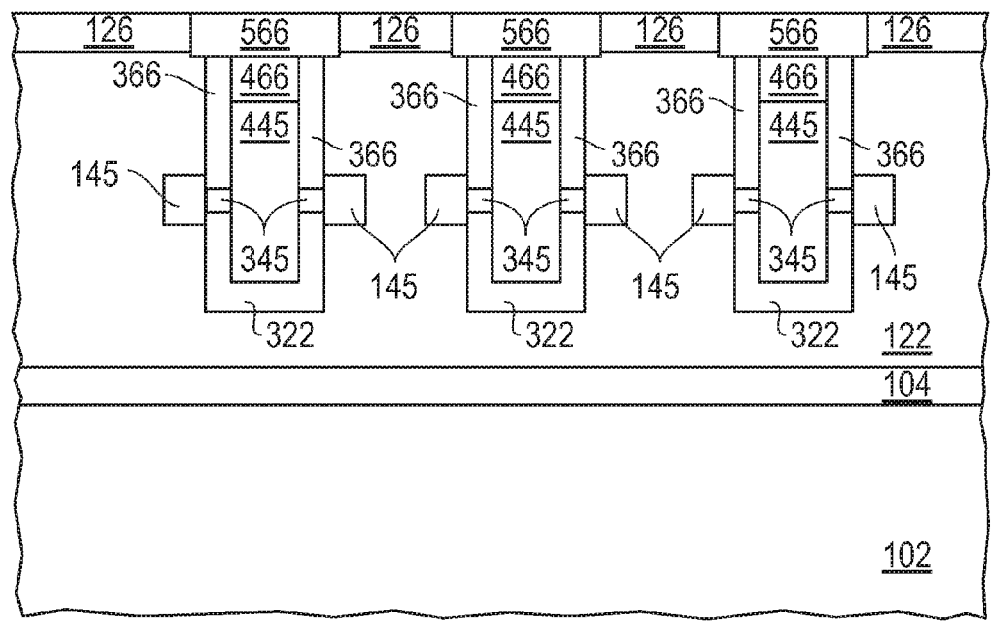
FIG. 5 includes an illustration of a cross-sectional view of the workpiece of FIG. 4 after forming insulators adjacent to the trenches.

FIG. 5 includes an illustration of a cross-sectional view of the workpiece after forming insulators 566 that can help to reduce capacitance between the heavily doped surface regions 126 and the field electrodes 445. Portions of the capping insulating layer 466, the heavily doped surface regions 126, and the lightly doped semiconductor layer 122 are removed and the insulators 566 are formed where the portions have been removed. In another embodiment, the insulators 566 may extend to an elevation above the uppermost surfaces of the heavily doped surface regions 126. In a further embodiment, the insulators 566 are not used, as a separate interlevel dielectric layer may be formed over the heavily doped surface regions 126 and capping insulating layer 466 and patterned to define contact openings 40 to the heavily doped surface regions 126.

If the heavily doped surface regions 126 were not formed early in the process, they can be formed after forming the upper insulating layer 366 as illustrated in FIG. 3, after forming the capping insulating layer 466 as illustrated in FIG. 4, or after forming the insulators 566 as illustrated in FIG. 5.

Figure 6:
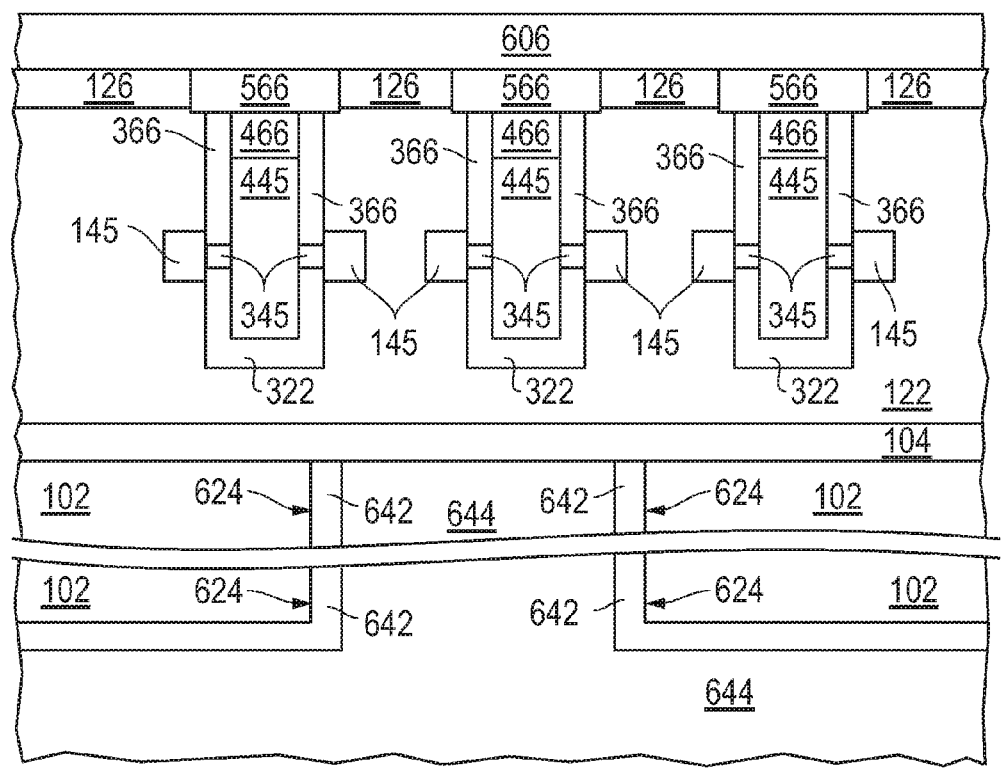
FIG. 6 includes an illustration of a cross-sectional view of the workpiece of FIG. 5 after forming a substantially completed electronic device.

FIG. 6 includes an illustration of a substantially completed electronic device. An interconnect 606 is formed over and contacts the heavily doped surface regions 126. The interconnect 606 can be part of or electrically connected to a drain/source terminal for the bidirectional JFET. Although not illustrated, another interconnect can be formed and connected to the gate electrodes 345 and the field electrodes 445. Such other interconnect may be formed along the same side of the workpiece as compared to the interconnect 606. In an embodiment, the substrate 102 can be patterned to define an opening 624 that exposes the heavily doped buried region 104. An insulator 642 can be formed along exposed surfaces of the substrate 102, including within the opening 624. An interconnect 644 can be formed along the insulator 642 and within the opening 624 to contact the heavily doped buried region 104.

The interconnects 606 and 644 can include a metal (atomic or as an alloy), a metal nitride, a metal silicide, another suitable metal-containing material or any combination thereof. In a particular embodiment, the interconnects 606 and 644 are mostly Al, Cu, Au, or the like. The interconnects 606 and 644 can have the same or different materials. The insulator 642 can include any of the material as described with respect to the lower insulating layer 322. The insulator 642 may have the same or different material as compared to the other insulating layers and insulators. If needed or desired, a passivation layer may be formed along either or both sides of the electronic device.

In a further embodiment, the heavily doped buried region 104 may be substantially thicker, and in a particular embodiment, the substrate or a portion of the substrate may be heavily doped and be a source/drain region for the transistor. During a backgrind or other similar operation, such heavily doped substrate or portion of the substrate may become exposed, thus, obviating the need for form the opening 624 and insulator 642. In such an embodiment, the interconnect 644 may for a direct contact to such heavily doped substrate or portion of the substrate. The depth of the opening from the backside of the die can go deeper into the heavily doped region 104 and is lined with an oxide. In the case of GaN on a Si or SiC substrate, the interface between highly doped region 104 and the Si or SiC substrate 102 can include several interfacial layers, such as AN, AlGaN, a superlattice structure, etc. A deeper etch from the backside of the wafer to the doped layer 104 may be used if needed or desired.

In the embodiment as illustrated, a vertical, depletion-mode bidirectional JFET has been formed. During one mode of operation, the interconnect 644 is at 0 V, and the interconnect 606 is at a relatively high voltage, such as above 150 V. During this mode of operation, the heavily doped buried region 104 is a common source for transistor structures that are parts of the JFET, and the heavily doped surface regions 126 are drains. When the gate electrodes 345 and field electrodes 445 are at 0 V, current flows from the heavily doped surface regions 126 to the buried doped region 104. When the gate electrodes 345 and field electrodes 445 are at a significant negative voltage, such as in a range of −6 V to −30 V, the doped regions 145 get reverse-biased with respect to the lightly doped semiconductor layer 122, causing a depletion region to form in the lightly doped semiconductor layer 122. This causes the portion of the lightly doped semiconductor layer 122 between the doped regions 145 to become pinched-off and current no longer flows through the transistor. The upper portion of the field electrodes 445 help to deplete majority carriers, namely electrons, within the lightly doped semiconductor layer 122. Hence, the lightly doped semiconductor layer 122 can be doped heavier, than it otherwise could in the absence of the field electrodes 445. Thus, the $R_{DSON}$ can be lower, and the $BV_{DS}$ can be higher than it otherwise would be in the absence of the field electrodes 445. Therefore, low resistance and high breakdown voltage can be achieved. In another mode of operation, the voltages for the interconnects 606 and 644 can be reversed, in which case, current flows from the heavily doped buried region 104 to the heavily doped surface regions 126.

Figure 7:
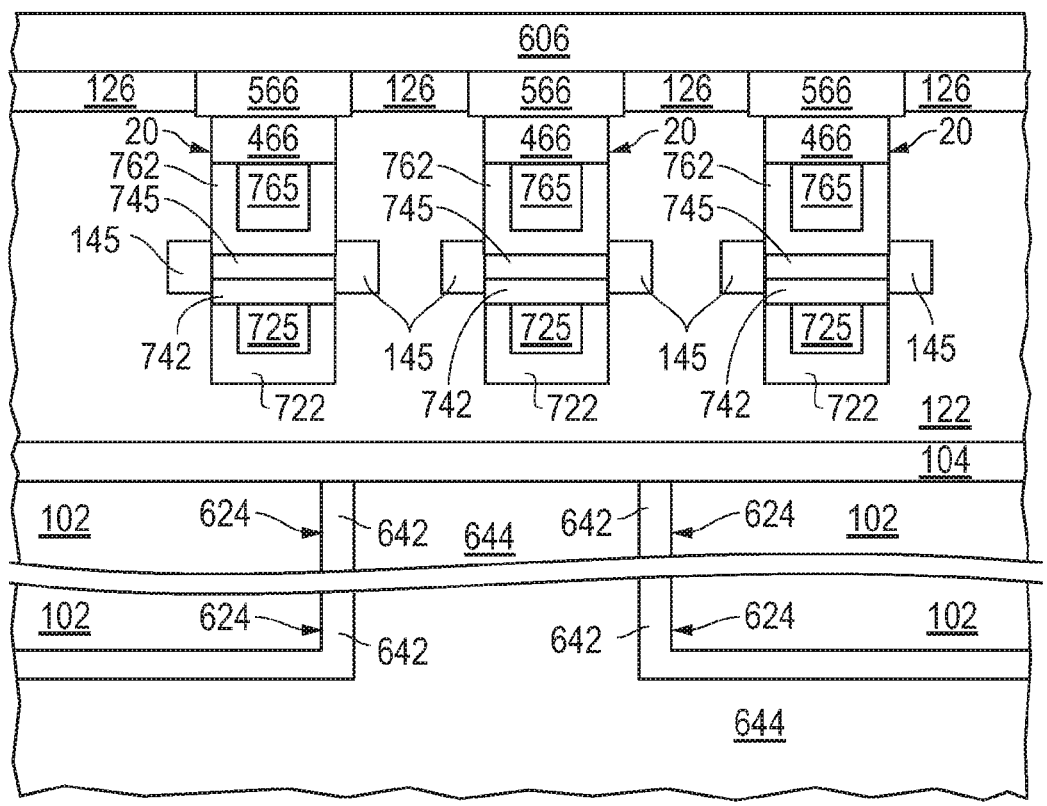
FIG. 7 includes an illustration of a cross-sectional view of a portion of a workpiece that includes a gate/field electrode configuration in accordance with an alternative embodiment.

FIG. 7 includes an illustration of an alternative embodiment where a gate electrode and field electrodes are separate from one another. Much of the processing of the embodiments as described with respect to FIGS. 1 to 6 is the same. Thus, the description of FIG. 7 focuses more on the features with the trenches 20. After forming the trenches, an insulating material and a conductive layer are formed within the trenches 20. The insulating material and conductive layer are etched back to form lower insulating layer 722 and the lower field electrodes 725. In an embodiment, an uppermost elevation of the lower field electrodes 725 is below a lowermost elevation of its corresponding doped regions 145. Another insulating material can be formed and fill the remainder of the trenches 20 and etched back to form the upper insulating layer 742. Another conductive layer can be formed and fill the remainder of the trenches 20 and etched back to form the gate electrodes 745, which contact the doped regions 145. An insulating layer 762 and upper field electrodes 765 can be formed in a manner similar to the lower insulating layer 722 and the lower field electrodes 725. In an embodiment, a lowermost elevation of the upper field electrodes 765 is above an uppermost elevation of its corresponding doped regions 145. The insulating layers 722, 742, and 762 can be formed using any of the materials as previously described with respect to the lower insulating layer 222, and the insulating layers 722, 742, and 762 may include the same or different materials as compared to one another. The conductive layers for the field electrodes 725 and 765 can include any of materials as described with respect to the field electrodes 445. The conductive layer for the gate electrodes 745 can include any of materials as described with respect to the gate electrodes 345. The field electrodes 725 and 765 and the gate electrodes 745 can include the same or different materials as compared to one another.

The embodiment as illustrated in FIG. 7 allows for more flexibility for biasing portions of the transistor during operation. In an embodiment, the lower field electrodes 725 can be electrically connected to the heavily doped surface regions 126, and the upper field electrodes 765 can be electrically connected to the heavily doped buried region 104. In another embodiment, the lower field electrodes 725, the upper field electrodes 765, or both sets of field electrodes can be put at voltage different from each of the heavily doped buried region 104, the heavily doped surface regions 126, and the gate electrodes 745. The values in the table below are merely exemplary and do not limit the scope of the present invention.

| | Surface regions 126 ($V_{surf}$) | Buried region 104 ($V_{br}$) | Gate electrodes 745 ($V_G$) | Upper field electrodes 765 ($V_{ue}$) | Lower field electrodes 725 ($V_{le}$) |
|---|---|---|---|---|---|
| Drain top/ source bottom On-state | +0.1 V to +100 V | 0 V | 0 V | $V_{br}$ or 0 V to +100 V | 0.01 to 0.99 times $V_{surf}$ |
| Drain top/ source bottom Off-state | +30 V to +1500 V | 0 V | −6 V to −30 V | $V_{br}$ or 0 to −0.01 times $V_{surf}$ | 0.01 to 0.99 times $V_{surf}$ |
| Source top/ drain bottom On-state | 0 V | +0.1 V to +100 V | 0 V | 0.01 to 0.99 times $V_{br}$ | $V_{surf}$ or 0 V to +100 V |
| Source top/ drain bottom Off-state | 0 V | +30 V to +1500 V | −6 V to −30 V | 0.01 to 0.99 times $V_{br}$ | $V_{surf}$ or 0 to −0.1 times $V_{br}$ |

Other biasing schemes can be used for the field electrodes 725 and 765. For example, both sets of field electrodes 725 and 765 may be at 0 V. Furthermore, the biasing may be different when an enhancement-mode transistor. After reading this specification, skilled artisans will be able to select voltages for the field electrodes 725 and 765 to meet the needs or desires for a particular application.

In a further embodiment, the insulating layer(s) within the trenches 20 may be formed so that along the sidewall, the insulating layer(s) are thicker closer to the heavily doped surface regions 126 and the heavily doped buried region 104, as compare to locations closer to the gate electrodes 445 or 745. More details regarding the formation and construction for such an embodiment can be found in US 2014/0054682, which is incorporated herein by reference in its entirety.

Embodiments as described herein have benefits over a conventional bidirectional JFET. The device structure with field electrode(s) allows a higher doping in the drift region, compared to the same device structure except without field electrodes, and still achieve a desired or required $BV_{DSS}$. This is because the field electrode(s) assist in depleting the drift region and lower the electric field. The higher doping enables lower $R_{DSON}$. Further, the field electrodes can be biased to form an accumulation region when the device is on, which further lowers the $R_{DSON}$.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device comprising a bidirectional JFET comprising:
 a drain/source region;
 a lightly doped semiconductor layer overlying the drain/source region;
 a source/drain region overlying the drain/source region and the lightly doped semiconductor layer;
 a first trench extending into the lightly doped semiconductor layer;
 a gate electrode within the first trench; and
 a first field electrode within the first trench.

Embodiment 2

The electronic device of Embodiment 1, further comprising a first doped region disposed between the drain/source region and the source/drain region, adjacent to the first trench, and electrically connected to the gate electrode.

Embodiment 3

The electronic device of Embodiment 2, wherein the first doped region has a conductivity type opposite a conductivity type of the lightly doped semiconductor layer.

Embodiment 4

The electronic device of Embodiment 2, further comprising:
 a second trench extending into the lightly doped semiconductor layer, wherein the first and second trenches are spaced apart from each other; and
 a second doped region disposed between the drain/source region and the source/drain region, adjacent to the second trench, spaced apart from the first doped region by a portion of the lightly doped semiconductor layer, and electrically connected to the gate electrode.

Embodiment 5

The electronic device of Embodiment 1, wherein the first field electrode is an only field electrode within the first trench and is electrically connected to gate electrode.

Embodiment 6

The electronic device of Embodiment 1, further comprising a second field electrode within the first trench, wherein no combination of the gate electrode, the first field electrode, and the second field electrode are electrically connected to one another.

Embodiment 7

The electronic device of Embodiment 6, wherein the first electrode is electrically connected to the source/drain region and lies closer to the drain/source region than to the source/drain region; and the second electrode is electrically connected to the drain/source region and lies closer to the source/drain region lies than to the drain/source region.

Embodiment 8

The electronic device of Embodiment 7, wherein each of the first and second field electrodes is not electrically connected to the drain/source region, the source/drain region, or the gate electrode.

Embodiment 9

The electronic device of Embodiment 1, wherein the bidirectional JFET is a depletion-mode transistor.

Embodiment 10

The electronic device of Embodiment 1, wherein the drain/source region, the source/drain region, and the lightly doped semiconductor layer include n-type GaN; and the doped region includes p-type GaN.

Embodiment 11

A process of forming an electronic device comprising:
providing a workpiece including a first doped region and a lightly doped semiconductor layer overlying the first doped region;
patterning the lightly doped semiconductor layer to define a trench extending into the lightly doped semiconductor layer;
forming a first insulating layer along a bottom and sidewall of the trench;
forming a gate electrode within the trench after forming the first insulating layer, wherein the gate electrode extends to a sidewall of the trench;
forming a second insulating layer within the trench after forming the gate electrode; and
forming a first field electrode within the trench,
wherein a bidirectional JFET includes the first doped region, the lightly doped semiconductor layer, and the gate electrode.

Embodiment 12

The process of Embodiment 11, further comprising forming a second doped region along a portion of a sidewall of the trench after forming the trench.

Embodiment 13

The process of Embodiment 12, wherein the second doped region extends laterally across part of and not all of the lightly doped semiconductor layer.

Embodiment 14

The process of Embodiment 13, wherein the bidirectional JFET is a depletion-mode transistor.

Embodiment 15

The process of Embodiment 12, wherein forming the second doped region is performed before patterning the lightly doped semiconductor layer.

Embodiment 16

The process of Embodiment 12, wherein forming the second doped region is performed by diffusing a dopant from the gate electrode into the lightly doped semiconductor layer.

Embodiment 17

The process of Embodiment 12, further comprising a third doped region overlying the lightly doped semiconductor layer, wherein in the finished electronic device, the third doped region is adjacent to a top of the trench.

Embodiment 18

The process of Embodiment 11, further comprising forming a backside contact to the first doped region.

Embodiment 19

The process of Embodiment 11, further comprising:
forming a second field electrode within the trench; and
forming a third insulating layer within the trench after forming the second field electrode,
wherein forming the first field electrode is performed before forming the gate electrode, and forming the second field electrode is formed after forming the second insulating layer.

Embodiment 20

The process of Embodiment 11, wherein the first field electrode in an only field electrode within the trench.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Accordingly, the disclosure is to be regarded as illustrative rather than restrictive.

What is claimed is:

1. An electronic device comprising a bidirectional junction field-effect transistor comprising:
a drain/source region having a first conductivity type;
a lightly doped semiconductor layer overlying the drain/source region;
a source/drain region having the first conductivity type and overlying the drain/source region and the lightly doped semiconductor layer;
a first trench extending into the lightly doped semiconductor layer;
an insulating layer lying along a bottom and sidewall of the first trench;

a gate electrode within the first trench and spaced apart from the drain/source region and the source/drain region, wherein the gate electrode is electrically isolated from the bottom of the first trench by at least the insulating layer;

a first doped region having a second conductivity type opposite the first conductivity type; and a first field electrode within the first trench, wherein:
the first doped region is spaced apart from the drain/source region and the source/drain region,
no other region of the second conductivity type is disposed between the first doped region and each of the drain/source and source/drain regions,
no other region of the second conductivity type is disposed between the bottom of the first trench and the drain/source region, and
the first doped region is adjacent to the first trench and electrically connected to the gate electrode.

2. The electronic device of claim 1, wherein the first field electrode is electrically connected to the gate electrode.

3. The electronic device of claim 1, wherein the first doped region has a conductivity type opposite a conductivity type of the lightly doped semiconductor layer.

4. The electronic device of claim 1, further comprising:
a second trench extending into the lightly doped semiconductor layer, wherein the first and second trenches are spaced apart from each other; and
a second doped region disposed between the drain/source region and the source/drain region, adjacent to the second trench, spaced apart from the first doped region by a portion of the lightly doped semiconductor layer, and electrically connected to the gate electrode.

5. The electronic device of claim 1, wherein the first field electrode is an only field electrode within the first trench and is electrically connected to the gate electrode.

6. The electronic device of claim 1, further comprising a second field electrode within the first trench, wherein no combination of the gate electrode, the first field electrode, and the second field electrode are electrically connected to one another.

7. The electronic device of claim 6, wherein:
the first field electrode is electrically connected to the source/drain region and lies closer to the drain/source region than to the source/drain region; and
the second field electrode is electrically connected to the drain/source region and lies closer to the source/drain region lies than to the drain/source region.

8. The electronic device of claim 7, wherein each of the first and second field electrodes is not electrically connected to the drain/source region, the source/drain region, or the gate electrode.

9. The electronic device of claim 1, wherein the bidirectional junction field-effect transistor has a voltage rating of at least 150 V in both current directions of the bidirectional junction field-effect transistor.

10. The electronic device of claim 1, wherein:
the drain/source region, the source/drain region, and the lightly doped semiconductor layer include n-type GaN; and
the doped region includes p-type GaN.

11. A process of forming an electronic device comprising:
providing a workpiece including a drain/source region and a lightly doped semiconductor layer overlying the drain/source region, wherein the drain/source region has a first conductivity type;

patterning the lightly doped semiconductor layer to define a trench extending into the lightly doped semiconductor layer;

forming a first doped region within the lightly doped semiconductor layer, wherein the first doped region has a second conductivity type opposite the first conductivity type; and forming a first insulating layer along a bottom and sidewall of the trench;

forming a gate electrode within the trench after forming the first insulating layer, wherein:
the gate electrode extends to a sidewall of the trench and is spaced apart from the drain/source region, and
the gate electrode is electrically isolated from the bottom of the trench by at least the first insulating layer;

forming a second insulating layer within the trench after forming the gate electrode;

forming a first field electrode within the trench; and forming a source/drain region having the first conductivity type such that the source/drain region overlies the drain/source region and the lightly doped semiconductor layer, wherein in a finished device:
a bidirectional junction field-effect transistor includes the drain/source region, the first doped region, the lightly doped semiconductor layer, the gate electrode, and the source/drain region,
the first doped region is spaced apart from the drain/source region and the source/drain region,
no other region of the second conductivity type is disposed between the first doped region and each of the drain/source and source/drain regions,
no other region of the second conductivity type is disposed between the bottom of the trench and the drain/source region, and
the first doped region is adjacent to the sidewall of the trench and electrically connected to the gate electrode.

12. The process of claim 11, further comprising forming a second doped region along a portion of a sidewall of the trench after forming the trench.

13. The process of claim 12, wherein the second doped region extends laterally across part of and not all of the lightly doped semiconductor layer.

14. The process of claim 13, wherein forming the first doped region comprises diffusing dopant from the gate electrode into the lightly doped semiconductor layer.

15. The process of claim 12, wherein forming the second doped region is performed before patterning the lightly doped semiconductor layer.

16. The process of claim 12, wherein forming the second doped region is performed by diffusing a dopant from the gate electrode into the lightly doped semiconductor layer.

17. The process of claim 12, wherein patterning the lightly doped semiconductor layer to define the trench is performed after forming the first doped region, and the trench extends through the first doped region.

18. The process of claim 11, further comprising forming a backside contact to the first doped region.

19. The process of claim 11, further comprising:
forming a second field electrode within the trench; and
forming a third insulating layer within the trench after forming the second field electrode, wherein forming the first field electrode is performed before forming the gate electrode, and forming the second field electrode is formed after forming the second insulating layer.

20. The process of claim 11, wherein the first field electrode is an only field electrode within the trench.

* * * * *